US011043628B2

(12) United States Patent
Dutta et al.

(10) Patent No.: US 11,043,628 B2
(45) Date of Patent: Jun. 22, 2021

(54) MULTI-LAYER BOTTOM ELECTRODE FOR EMBEDDED MEMORY DEVICES

(71) Applicant: International Business Machines Corporation, Armonk, NY (US)

(72) Inventors: Ashim Dutta, Menands, NY (US); Ekmini Anuja De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/595,572

(22) Filed: Oct. 8, 2019

(65) Prior Publication Data

US 2021/0104660 A1 Apr. 8, 2021

(51) Int. Cl.
*H01L 43/02* (2006.01)
*H01L 27/22* (2006.01)
*H01L 43/12* (2006.01)

(52) U.S. Cl.
CPC ............ *H01L 43/02* (2013.01); *H01L 27/222* (2013.01); *H01L 43/12* (2013.01)

(58) Field of Classification Search
CPC ........ H01L 43/02; H01L 43/12; H01L 27/222
See application file for complete search history.

(56) References Cited

U.S. PATENT DOCUMENTS

| | | | |
|---|---|---|---|
| 6,686,263 B1 | 2/2004 | Lopatin et al. | |
| 6,979,881 B2 | 12/2005 | Joo et al. | |
| 9,166,154 B2 | 10/2015 | Satoh et al. | |
| 9,299,745 B2 | 3/2016 | Zhang et al. | |
| 10,096,769 B2 | 10/2018 | Bhosale et al. | |
| 2008/0090307 A1 | 4/2008 | Xiao et al. | |
| 2010/0311243 A1 | 12/2010 | Mao | |
| 2015/0295172 A1* | 10/2015 | Sung | H01L 45/1233 257/2 |
| 2015/0299848 A1 | 10/2015 | Haukka et al. | |
| 2015/0325622 A1* | 11/2015 | Zhang | H01L 43/08 257/421 |
| 2016/0072045 A1* | 3/2016 | Kanaya | H01L 43/08 257/427 |
| 2016/0322421 A1* | 11/2016 | Ito | H01L 43/08 |
| 2017/0092851 A1* | 3/2017 | Han | H01L 43/10 |
| 2018/0240971 A1 | 8/2018 | Briggs et al. | |
| 2019/0312197 A1* | 10/2019 | Yang | G11C 11/161 |
| 2020/0106000 A1* | 4/2020 | Chiu | H01L 27/222 |

OTHER PUBLICATIONS

Nguyen et al, "Selective CVD metal deposition for nano device fabrication," 2nd Area Selective Deposition Workshop, ASD, 2017, 1 pp.
Yang et al., "Selective chemical vapor deposition-grown Ru for Cu interconnect capping applications," Electrochemical and Solid-State Letters, vol. 13, No. 5, 2010, pp. D33-D35.

* cited by examiner

*Primary Examiner* — Herve-Louis Y Assouman
(74) *Attorney, Agent, or Firm* — Cantor Colburn LLP; Abdy Raissinia

(57) ABSTRACT

Provided are embodiments for a semiconductor device that includes a bottom contact; a multi-layer bottom electrode formed over the bottom contact; a magnetic tunnel junction stack formed over the multi-layer bottom electrode; and a top electrode formed over the magnetic tunnel junction stack. Also provided are embodiments for forming the semiconductor device described herein.

19 Claims, 14 Drawing Sheets

MULTI-LAYER BOTTOM ELECTRODE FOR EMBEDDED MEMORY DEVICES

BACKGROUND

The present invention generally relates to fabrication methods and resulting structures for a semiconductor device, and more specifically to fabrication methods and resulting structures for a multi-layer bottom electrode for an embedded memory device.

Unlike conventional random access memory (RAM) chip technologies that store data an electric charge or current flows, data in magnetic RAM (MRAM) is stored by magnetic storage elements. The magnetic storage elements can be formed from two ferromagnetic plates separated from each other by a thin insulating layer to define a magnetic tunnel junction (MTJ). The resistive state (high or low) of the insulating layer determines whether the MTJ is storing a zero (0) or a one (1). The resistive state of the insulating layer can be changed by changing the relative magnetization directions of the ferromagnetic plates. One of the two ferromagnetic plates is a permanent magnet set to a particular magnetization direction, while the other ferromagnetic plate has a magnetization direction that can be changed to match that of an external field or that can be changed using an applied current. The resistive state of the insulating layer is written to or read by changing the magnetization direction of one of the ferromagnetic plates.

The tunneling magnetoresistance of a MTJ determines the difference in the resistance between the high and low resistance states. A relatively high difference between the high and low resistance states facilitates read operations in the MRAM.

SUMMARY

Embodiments of the present invention are directed to a method for forming a multi-layer bottom electrode for an embedded memory device. A non-limiting example of the method includes forming a bottom contact; forming a multi-layer bottom electrode over the bottom contact; forming a magnetic tunnel junction stack on the multi-layer bottom electrode; and forming a top electrode on the magnetic tunnel junction stack.

Embodiments of the present invention are directed to a semiconductor device having a multi-layer bottom electrode for an embedded memory device. The semiconductor includes a bottom contact; a multi-layer bottom electrode that is formed over the bottom contact; a magnetic tunnel junction stack that is formed over the multi-layer bottom electrode; and a top electrode that is formed over the magnetic tunnel junction stack.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
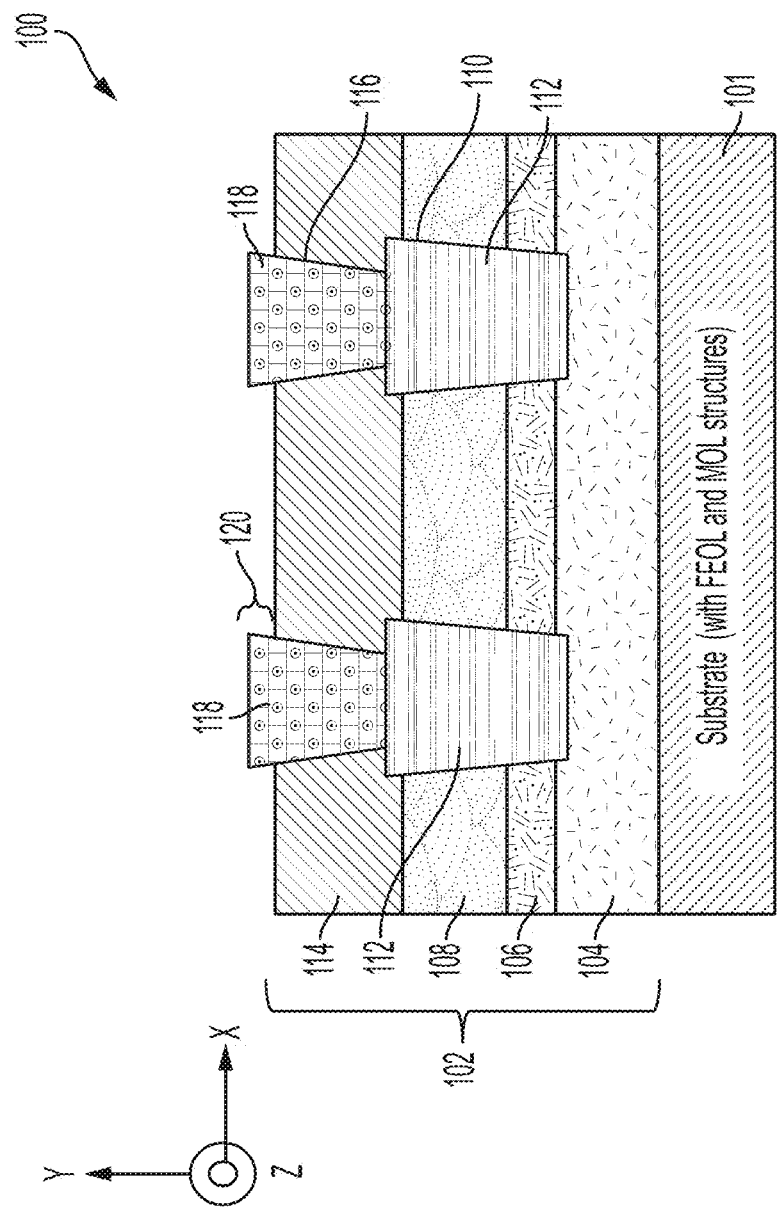
FIG. 1 depicts a cross-sectional view of a structure having semiconductor layers formed on a substrate during an intermediate operation of a method of fabricating a semiconductor device according to one or more embodiments of the present invention.

The diagrams depicted herein are illustrative. There can be many variations to the diagram, or the operations described therein without departing from the spirit of the invention. For instance, the actions can be performed in a differing order or actions can be added, deleted or modified. Also, the term "coupled", and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number corresponds to the figure in which its element is first illustrated.

DETAILED DESCRIPTION

It is understood in advance that although example embodiments of the invention are described in connection with a particular magnetic tunnel junction architecture, embodiments of the invention are not limited to the particular magnetic tunnel junction architectures or materials described in this specification. Rather, embodiments of the present invention are capable of being implemented in conjunction with any other type of magnetic tunnel junction architecture or materials now known or later developed.

For the sake of brevity, conventional techniques related to the semiconductor device and the integrated circuit (IC) fabrication may or may not be described in detail herein. Moreover, the various tasks and process steps described herein can be incorporated into a more comprehensive procedure or process having additional steps or functionality not described in detail herein. In the interest of brevity and because many steps in the manufacture of semiconductor devices and semiconductor-based ICs are well known, these steps will either be only mentioned briefly herein or will be omitted entirely without providing the well-known process details.

Turning now to an overview of technologies that are more specifically relevant to aspects of the invention, the ICs are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where the device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

Magnetoresistive random access memory (MRAM) is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the magnetic tunnel junction storage element (or "bit") results in a change to the magnetic tunnel junction resistance, hence the name "Magnetoresistive" RAM. Data is stored in MRAM as magnetic states or characteristics (e.g., magnetization direction, magnetic polarity, magnetic moment, etc.) instead of electric charges. In a typical configuration, each MRAM cell includes a transistor, a magnetic tunnel junction device for data storage, a bit line and a word line. In general, the magnetic tunnel junction's electrical resistance will be high or low based on the relative magnetic states of certain magnetic tunnel junction layers. Data are written to the magnetic tunnel junction by applying certain magnetic fields or charge currents to switch the magnetic states of certain magnetic tunnel junction layers. Data are read by detecting the resistance of the magnetic tunnel junction. Using a magnetic state/characteristic for storage has two main benefits. First, unlike electric charge, the magnetic state does not leak away with time so the stored data remain even when system power is turned off. Second, switching magnetic states has no known wear-out mechanism.

MRAM formed from memory structures such as MTJ stacks can be embedded in BEOL interconnect structures. The MTJ stack can be electrically accessed through top and bottom contacts/electrodes that are coupled to top and bottom ends, respectively, of the MJT stack. Embedding the MRAM devices seamlessly with standard back-end-of-line (BEOL) logic technology requires the device height to match the separation between the two BEOL metal levels. The bottom electrode thickness plays a critical role in meeting the height requirement. Using conventional MRAM patterning, the bottom electrode thickness is limited by the difficulty of etching it using ion beam etch (IBE). The redeposition of the sputtered metal along the sidewall of the MRAM devices and the low mask selectivity during IBE limit the thickness of the bottom electrode to less than 10-15 nm. In addition, the thick bottom electrode can cause the metal redeposition process on the magnetic tunnel junction device to result in short circuits across the tunnel junction. Also, the footer flaring of the bottom electrode that occurs during fabrication using the conventional techniques can increase device footprint.

Turning now to an overview of the aspects of the invention, one or more embodiments of the invention address the above-described shortcomings of the prior art by providing a method and structure for increasing the thickness of the bottom electrode by forming a multi-layer bottom electrode. The bottom layer of the multi-layer bottom electrode is the thickest layer and is self-aligned with the bottom contact. In addition, the thickness of the bottom layer can be adjusted to meet the total device height requirement without increasing the further redeposition and mask loss during IBE. The top layer of the multi-layer bottom electrode is deposited above the self-aligned layer to provide a flat surface for the deposition of the magnetic tunnel junction material. The total thickness of the top layer of the multi-layer bottom electrode is selected to be thinner than the bottom layer to reduce the metal redeposition on the magnetic tunnel junction device during the patterning of this layer using IBE.

Turning now to a more detailed description of aspects of the present invention, FIG. 1 depicts a cross-sectional view of a structure 100 after an initial set of fabrication operations have been applied according to one or more embodiments of the present invention. In accordance with aspects of the invention, the structure 100 can be a portion of an integrated circuit. Although the structure 100 is depicted in the figures in two dimensions, it is understood by those skilled in the relevant arts that the structure 100 is three-dimensional, and the various components of the structure 100 illustrated in the figures extend along a first axis (e.g., X-axis) to define a length, a second axis (e.g., Y-axis) perpendicular to the X-axis to define a height, and a third axis (e.g., Z-axis) to define a width.

As shown in FIG. 1, the structure 100 includes an underlying structure 102 formed over a substrate 101. The substrate 101 can include FEOL and MOL structures. The underlying structure 102 will support a to-be-formed magnetic tunnel junction stack 610 (shown in FIG. 6). In accordance with embodiments of the invention, the layers 104, 106, and 108 are deposited over the substrate 101 using any suitable deposition technique. Layer 104 is a MOL layer, and layer 106 is a cap/etch stop layer that has been formed on the MOL dielectric layer 104. The layer 104 can be formed of moderate k dielectric materials such as TEOS or other oxides. In addition, layer 104 can be formed of materials that are low-k, ULK, etc. The layer 106 can be formed of material such as SiN, SiC, SiCN(H), etc. Layer 108 (e.g., an oxide) has been formed on the cap/etch stop layer 106. The layer 108 can be formed of moderate k dielectric materials such as TEOS, other oxides, low-k materials, ULK materials, etc. After forming a first set of trenches in the layers 104, 106, 108, metal liners 110 and contacts 112 are deposited in the trenches, and the structure 100 is planarized. A layer 114, which can be a line layer, is formed on the layer 108 and the contacts 112. A set of trenches is formed in the layer 114, and metal liners 116 and bottom contacts 118 are deposited in the trenches and the structure 100 is planarized. The liners 110 and 116 can be formed using materials such as Co, W, WN, Ta, TaN, Ti, TiN, Ru, Al, etc. In one or more embodiments of the invention, the contacts 112 and 118 can be contacts having a top-down view shape formed as a square, a circle, or a rectangle. In some embodiments of the invention, the contacts 112 and/or 118 can be metallization lines that run in a pattern throughout the layer in which it resides. The contacts 112, 118 can be formed using materials such as Cu, W, Co, Ru, etc.

The planarization (e.g., using CMP) applied to the structure 100 exposes a topmost surface of the bottom contact 118. In one or more embodiments of the invention, a portion of the metal liner 116 and a portion of the bottom contact 118 are also exposed by, for example, applying a suitable etch that is selective to the layer 114. The height 120 of the exposed portions of the contact 118 and the liner 116 can be controlled and will form a surface for a to-be-formed bottom layer 210 (shown in FIG. 2) of the multi-layer bottom electrode. It should be understood that any suitable etch-back process can be performed to expose the portion of the bottom contact 118 and the portion of the liner 116.

Figure 2:
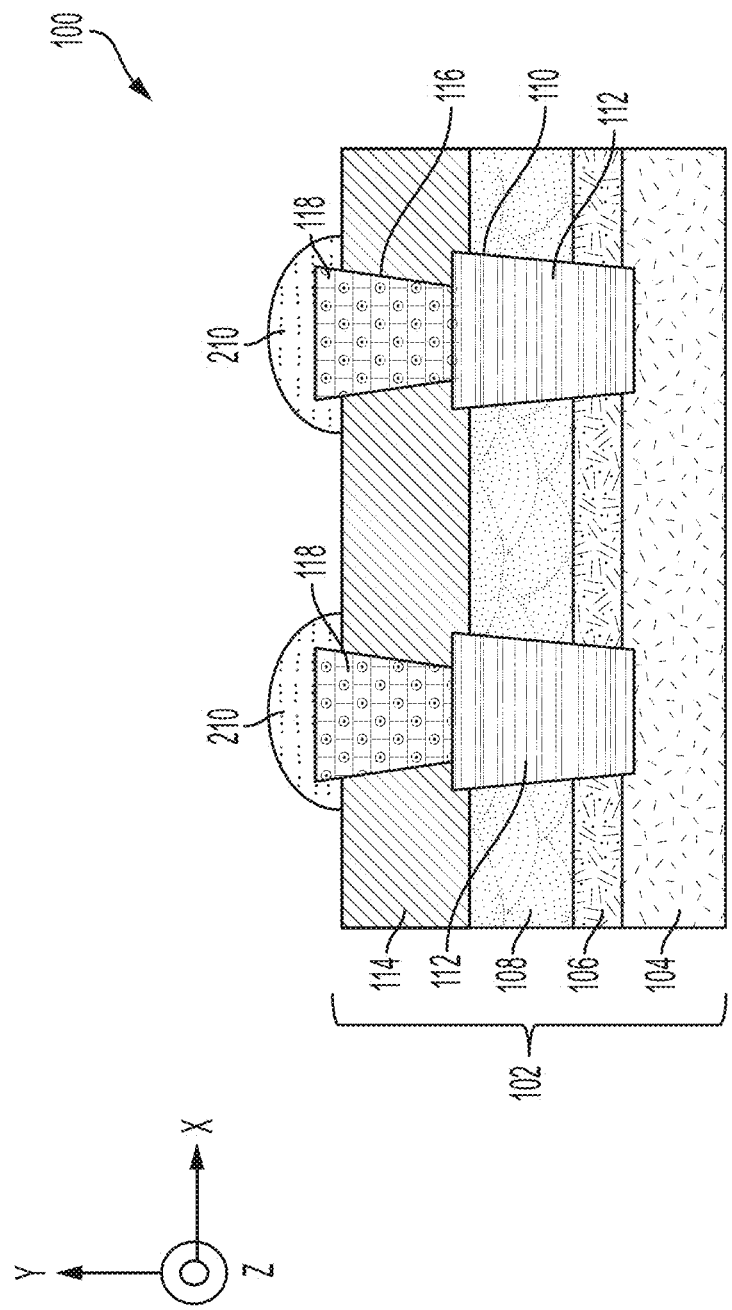
FIG. 2 depicts a cross-sectional view of a semiconductor structure after a processing operation according to one or more embodiments of the invention.

FIG. 2 depicts a cross-sectional view of a structure 100 after a processing operation according to one or more embodiments of the invention. In particular, FIG. 2 illustrates a cross-sectional view of a structure 100 after forming the bottom layer 210 of the multi-layer bottom electrode over the exposed bottom contact 118. In one or more embodiments of the invention, the bottom layer 210 is dome shaped due to the process, where the metal of the bottom layer 210 adheres to the metal of the bottom contact 118. As shown in FIG. 2, a bottom most portion of the bottom layer 210 is below the topmost portion of the metal liner 116 and the bottom contact 118. In other words, a portion of the bottom layer 210 contacts the sidewall of the metal liner/bottom contact 116, 118, respectively. This configuration allows for reliable contact to be formed between the bottom contact 118 and the bottom layer 210.

In one or more embodiments of the invention, the bottom layer 210 of the multi-layer bottom electrode is formed from any suitable metal using a selective deposition process for the metal on top of the bottom contact 118.

The bottom layer 210 is a self-aligned layer and remains unexposed during an ion beam etch process. The thickness of the bottom layer 210 can be adjusted to meet the total device height requirement without increasing any further redeposition and mask loss during ion beam etch (IBE).

Figure 3:
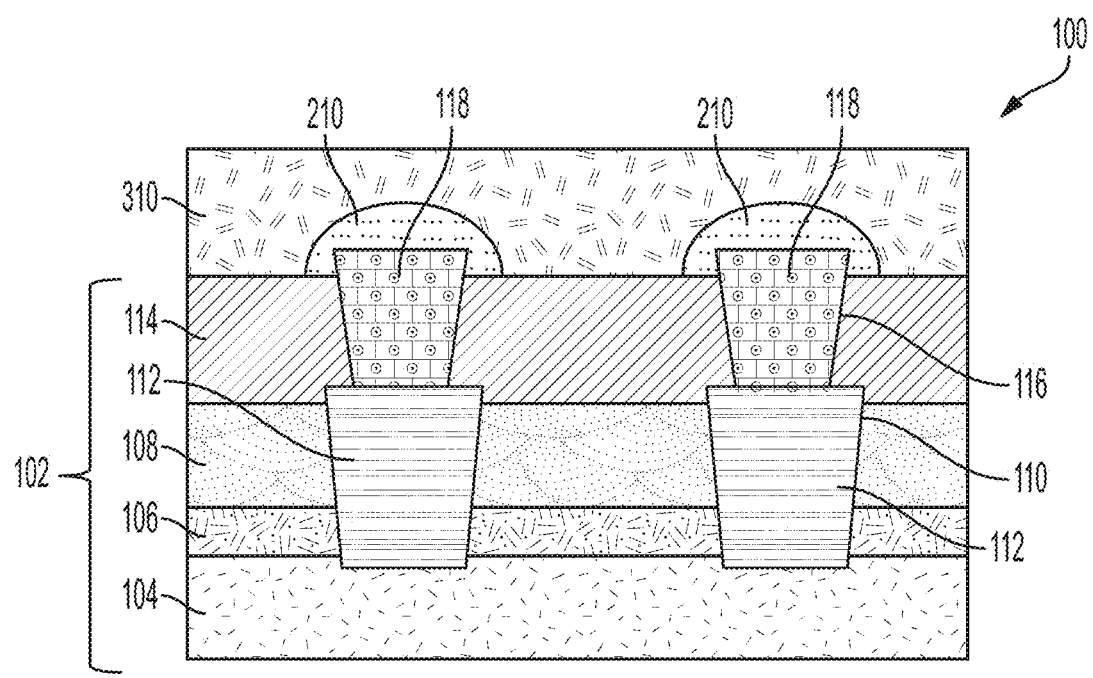
FIG. 3 depicts a cross-sectional view of a semiconductor structure after a processing operation according to one or more embodiments of the invention.

FIG. 3 illustrates a cross-sectional view of a structure 100 after a processing operation according to one or more embodiments of the invention. As illustrated in FIG. 3, a dielectric layer 310 has been deposited over the structure 100 and planarized. The dielectric layer 310 is deposited over the top surface of the top layer of the underlying structure 102 and the bottom layer 210 of the multi-layer bottom electrode.

Figure 4:
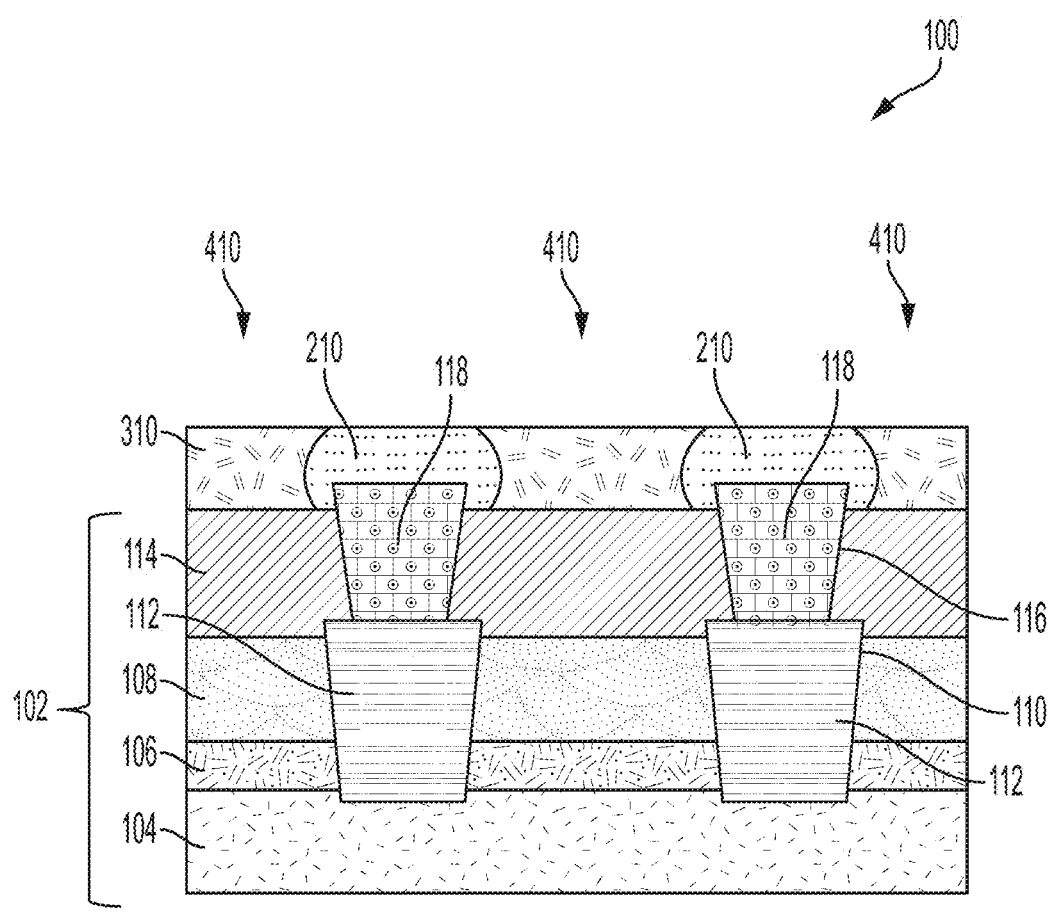
FIG. 4 depicts a cross-sectional view of a semiconductor structure after a processing operation according to one or more embodiments of the invention.

FIG. 4 illustrates a cross-sectional view of a structure 100 after a processing operation according to one or more embodiments of the invention. As shown in FIG. 4, a dielectric CMP has been performed to recess the dielectric layer 310 and expose a top surface of the bottom layer 210.

Figure 5:
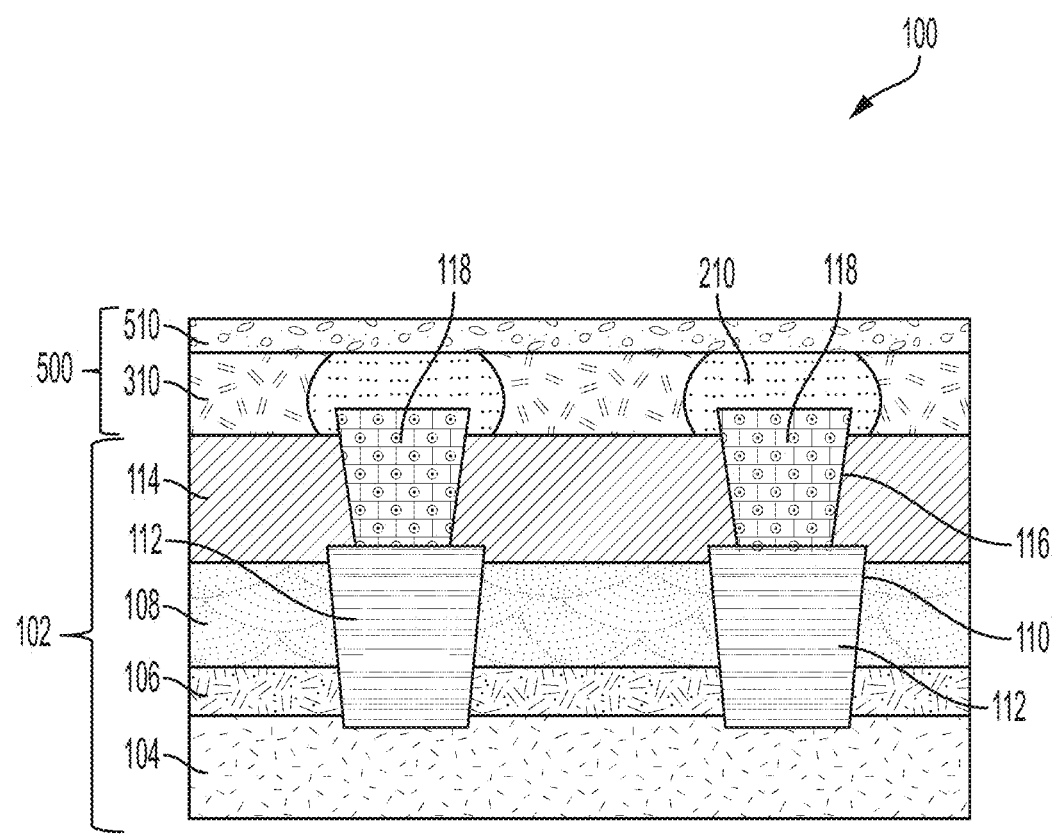
FIG. 5 depicts a cross-sectional view of a semiconductor structure after a processing operation according to one or more embodiments of the invention.

FIG. 5 illustrates a cross-sectional view of a structure 100 after a processing operation according to one or more embodiments of the invention. FIG. 5 illustrates a top layer 510 of a multi-layer bottom electrode 500 that has been formed over the structure 100. In one or more embodiments of the invention, the top layer 510 is formed by an ALD process.

Figure 6:
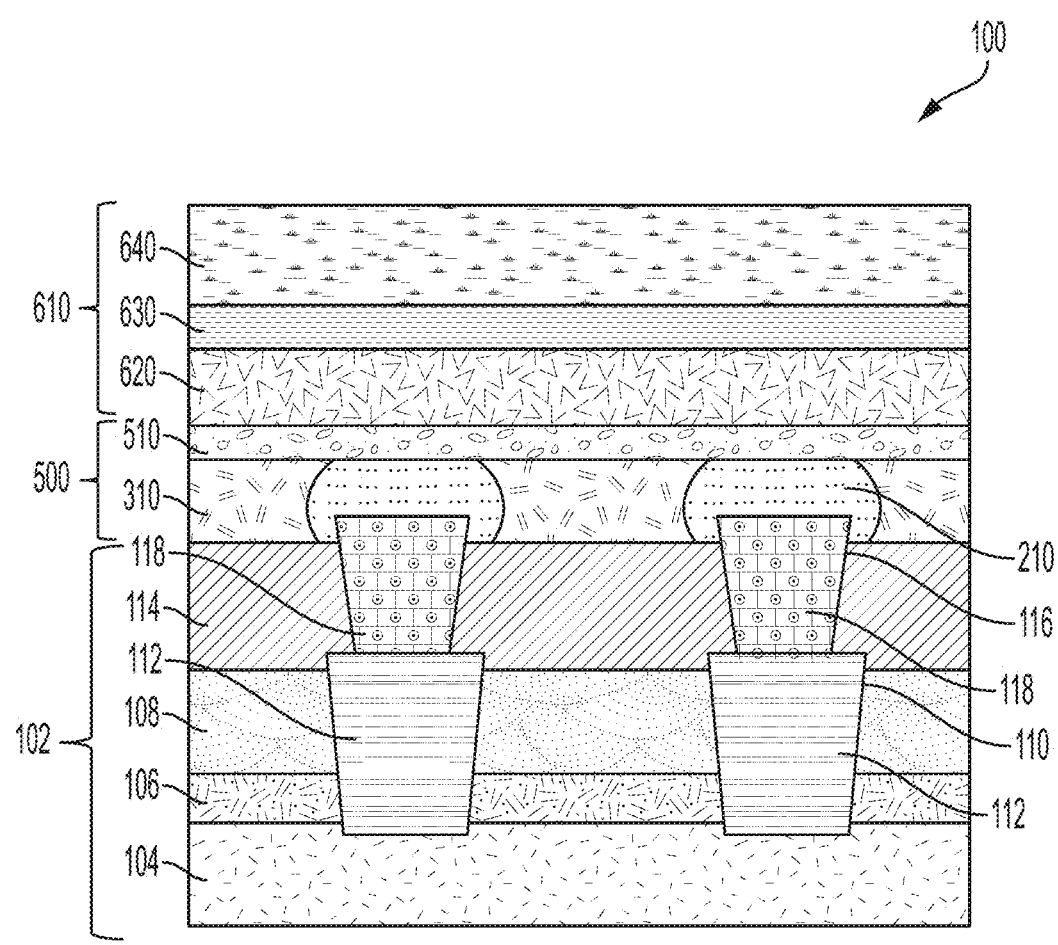
FIG. 6 depicts a cross-sectional view of a semiconductor structure after a processing operation according to one or more embodiments of the invention.

In one or more embodiments of the invention, the top layer 510 of the multi-layer bottom electrode 500 is buff polished to provide a flat surface for the deposition of the magnetic tunnel junction material shown with reference to FIG. 6.

In one or more embodiments of the invention, the total thickness of the layer 510 is restricted to 10 nm or less for improving the mask budget and further reducing the redeposition along the sidewall of the magnetic tunnel junction stack 610. In embodiments of the invention, the layer 510 can include multiple layers of different metals. Materials for the various layers of the top layer 510 and bottom layer 210 of the multi-layer bottom electrode 500 can include but are not limited to Nb, NbN, W, WN, Ta, TaN, Ti, TiN, Ru, Mo, Cr, V, Pd, Pt, Rh, Sc, Al, Cu, CuMn, and Mn.

In one or more embodiments of the invention, the thickness (or height) of the bottom layer 210 varies along the x-axis. In some embodiments of the invention, the maximum thickness of the bottom layer 210 is greater than about 10 nm, and the thickness of the top layer 510 is less than about 10 nm in thickness.

Unlike the conventional prior art techniques, there is no footer flaring of the bottom electrode because only the thin top layer 510 of the multi-layer bottom electrode 500 requires the IBE. In addition, unlike the conventional prior art techniques, there is no residue across the magnetic tunnel junction that can potentially lead to shorting of the magnetic tunnel junction.

FIG. 6 illustrates a cross-sectional view of a structure 100 after a processing operation according to one or more embodiments of the invention. A magnetic tunnel junction stack 610 is formed over the multi-layer bottom electrode 500 in accordance with one or more embodiments of the invention. To form the magnetic tunnel junction stack 610, a reference layer 620 is formed on the multi-layer bottom electrode 500; a tunnel barrier layer 630 is formed on the reference layer 620; and the free layer 640 is formed on the tunnel barrier layer 630. The reference layer 620 and the free layer 640 include conductive, magnetic materials, for example, metals or metal alloys. The reference layer 620 and the free layer 640 can be formed by employing a deposition process, for example, PVD, IBD, ALD, electroplating, or other like processes.

The reference layer 620 and the free layer 640 can include one layer or multiple layers. The reference layer 620 and the free layer 640 can include the same materials and/or layers or different materials and/or layers. Non-limiting examples of materials for the reference layer 620 and/or the free layer 640 include iron, cobalt, boron, aluminum, nickel, silicon, oxygen, carbon, zinc, beryllium, vanadium, boron, magnesium, or any combination thereof.

The reference layer 620 has a thickness that can generally vary and is not intended to be limited. In some embodiments, the reference layer 620 has a thickness in a range from about 10 to about 25 nm. In other embodiments, the reference layer 620 has a thickness in a range from about 2 to about 10 nm.

The free layer 640 has a thickness that can generally vary and is not intended to be limited. In some embodiments, the free layer 640 has a thickness in a range from about 2 to about 5 nm. In other embodiments, the free layer 640 has a thickness in a range from about 1 to about 2 nm.

The tunnel barrier layer 630 includes a non-magnetic, insulating material. A non-limiting example of an insulating material for the tunnel barrier layer 630 is magnesium oxide (MgO). The tunnel barrier layer 630 can be formed on the reference layer by, for example, radiofrequency (RF) sputtering in some embodiments. Alternatively, the tunnel barrier layer 630 is formed by oxidation (e.g., natural or radical oxidation) of a magnesium (Mg) layer deposited on the reference layer 620. After oxidation, the MgO layer can then be capped with a second layer of Mg. The thickness of the tunnel barrier layer 630 is not intended to be limited and can generally vary.

Figure 7:
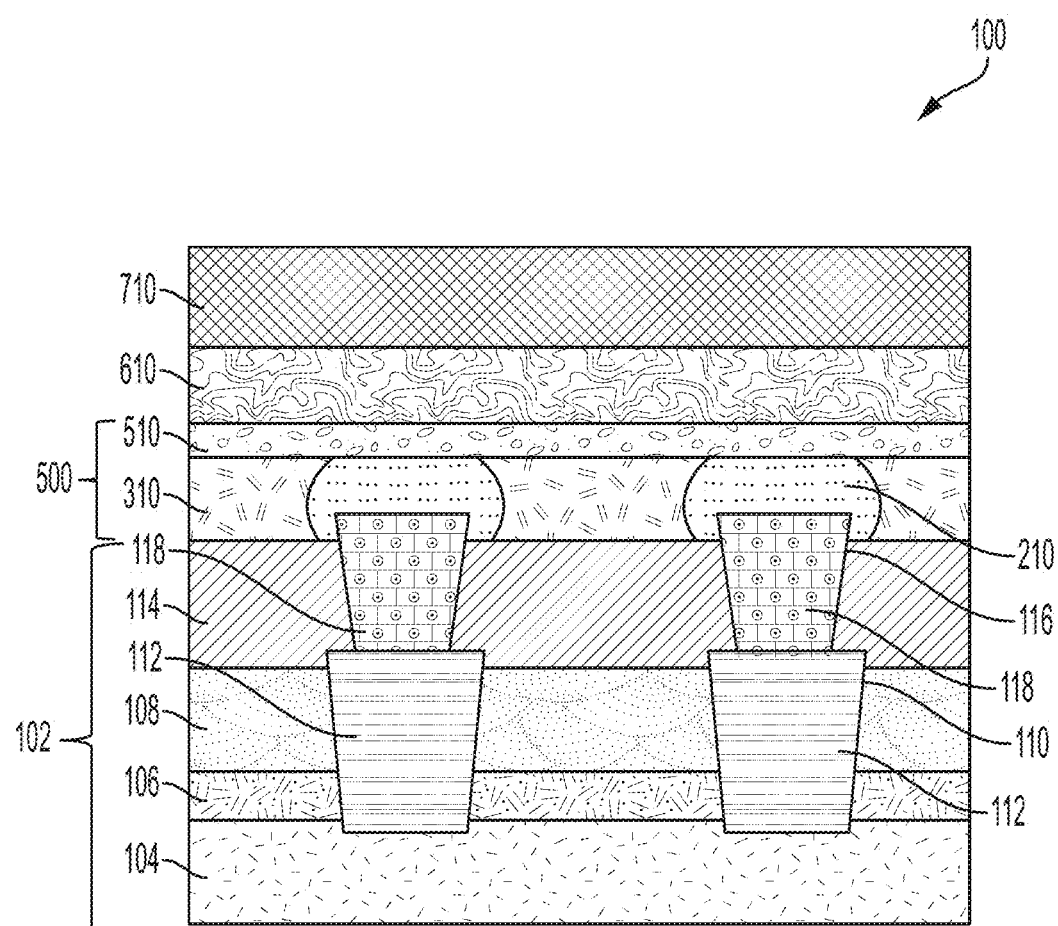
FIG. 7 depicts a cross-sectional view of a semiconductor structure after a processing operation according to one or more embodiments of the invention.

FIG. 7 illustrates a cross-sectional view of a structure 100 after a processing operation according to one or more embodiments of the invention. As shown in FIG. 7, after depositing the magnetic tunnel junction stack 610 on the multi-layer bottom electrode 500, a top electrode 710 is deposited over the magnetic tunnel junction stack 610.

Figure 8:
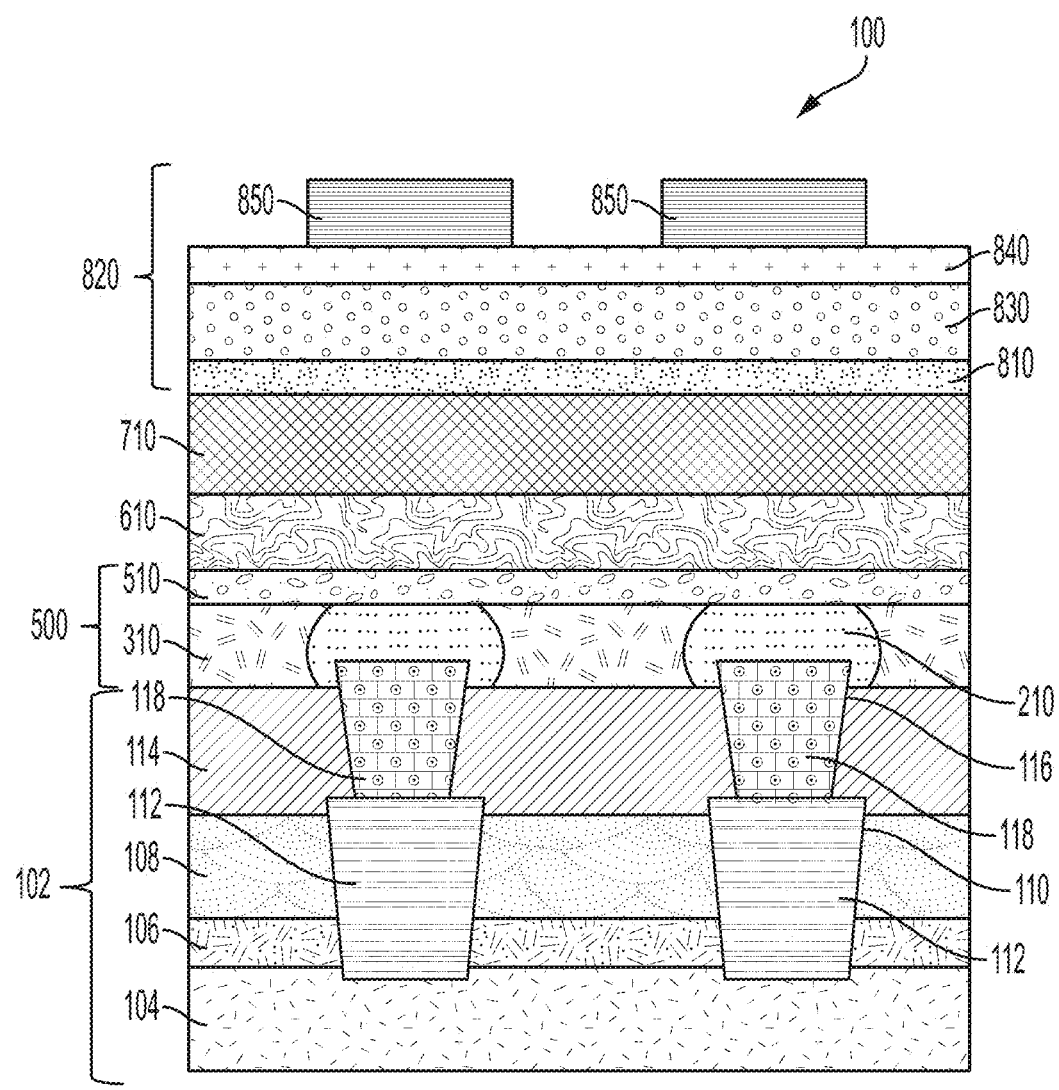
FIG. 8 depicts a cross-sectional view of a semiconductor structure after a processing operation according to one or more embodiments of the invention.

FIG. 8 illustrates a cross-sectional view of a structure 100 after a processing operation according to one or more embodiments of the invention. After depositing the top electrode 710 on the magnetic tunnel junction stack 610, the magnetic tunnel junction stack 610 is patterned. In some embodiments, a hard mask 810 material layer can be disposed on the magnetic tunnel junction stack 610. The hard mask 810 material layer is then patterned by etching, for example, using a reactive ion etch (RIE) process or a halogen-based chemical etch process (e.g., including chlorine-containing gas and/or fluorine-containing gas chemistry). The pattern from the hard mask 810 is transferred into the free layer 640, tunnel barrier layer 630, and reference layer 620. The free layer 640, tunnel barrier layer 630, and reference layer 620 are etched by, for example, performing a etch process described below. The stack etch process can be a RIE process or an IBE process.

In some embodiments of the invention, the hard mask 810 includes a patterning film stack. In some embodiments of the invention, the film stack is a bi-layer stack, a tri-layer stack, or a multi-layer stack having a topmost photoresist layer. In some embodiments of the invention, the film stack is a tri-layer stack 820 having an organic planarization layer (OPL) 830, an antireflective coating 840, and a photoresist 850. Patterning film stacks typically include OPLs 830 because high-resolution photoresists themselves often do not provide enough etch resistance for pattern transfer. OPLs 830 are used as etch masks for pattern transfers into inorganic substrates, to fill pre-existing features, and to planarize the substrate to allow for larger patterning process windows.

In some embodiments of the invention, the OPL 830 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 830 can include any organic polymer and a photo-active compound having a molecular structure that can attach to the molecular structure of the organic polymer. In some embodiments of the invention, the OPL material is selected to be compatible with an overlying antireflective coating, the overlying photoresist, and the lithographic wavelength employed (i.e., ArF, KrF, etc.). In some embodiments, the OPL 830 can be applied using, for example, spin coating technology.

The antireflective coating 840 can be made of any suitable antireflective material, such as, for example, a low temperature oxide (LTO), SiARC, TiARC, or SiON. In some embodiments of the invention, the antireflective coating 840 is SiARC. The antireflective coating 840 can be deposited using, for example, a spin-on process. In some embodiments of the invention, the antireflective coating 840 is deposited to a thickness of about 0.5 to about 5 nm, although other thicknesses are within the contemplated scope of the invention.

The photoresist 850 can include any suitable photoresist material, such as, for example, 248 nm resists, 193 nm resists, 157 nm resists, or EUV (extreme ultraviolet) resists. In some embodiments of the invention, the photoresist 850 can be made of a light sensitive polymer, and can be deposited using any suitable resist process, such as spin-on coating.

Figure 9:
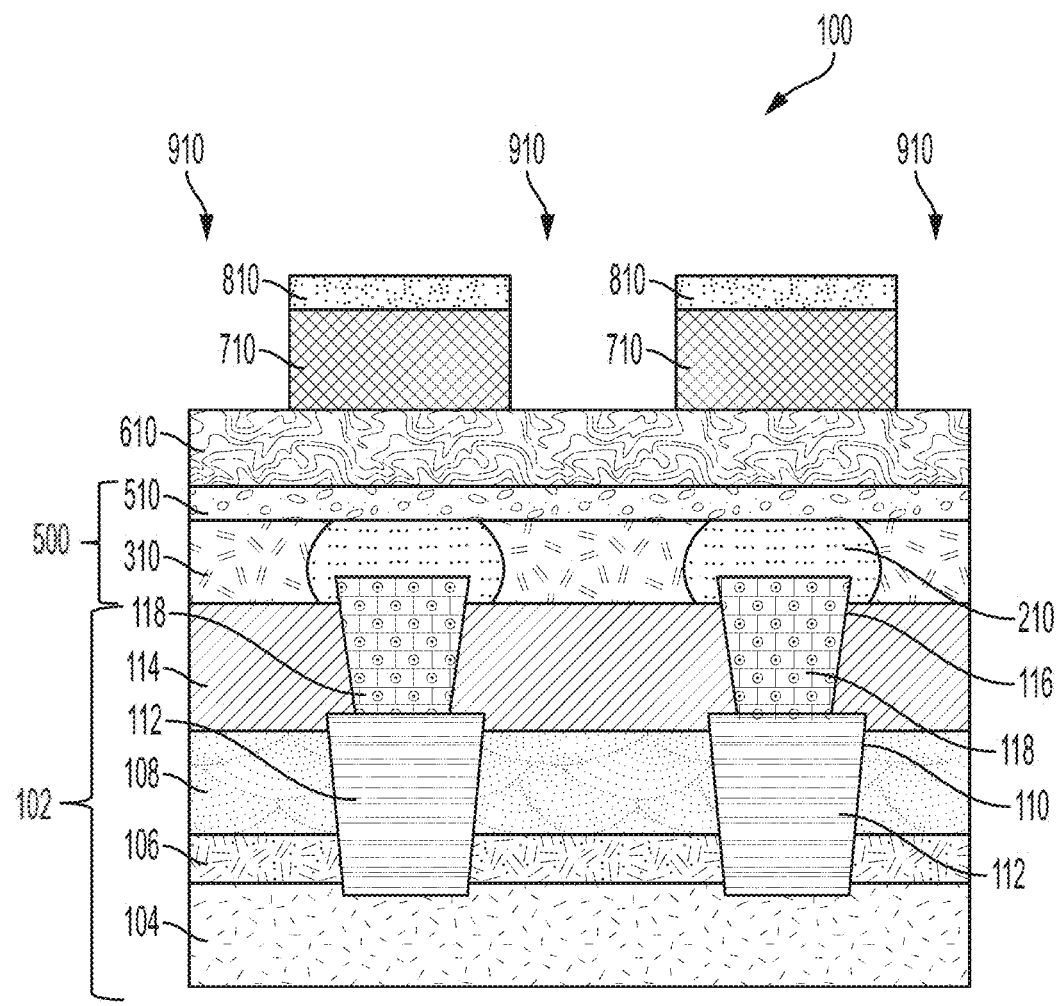
FIG. 9 depicts a cross-sectional view of a semiconductor structure after a processing operation according to one or more embodiments of the invention.

FIG. 9 illustrates a cross-sectional view of a structure 100 after a processing operation according to one or more embodiments of the invention. A trench 910 has been formed by an etch process exposing sidewalls of the top electrode 710 and the dielectric hard mask 810. In one or more embodiments of the invention, a RIE is performed to form the trench 910. It should be understood that other etching processes can be performed.

Figure 10:
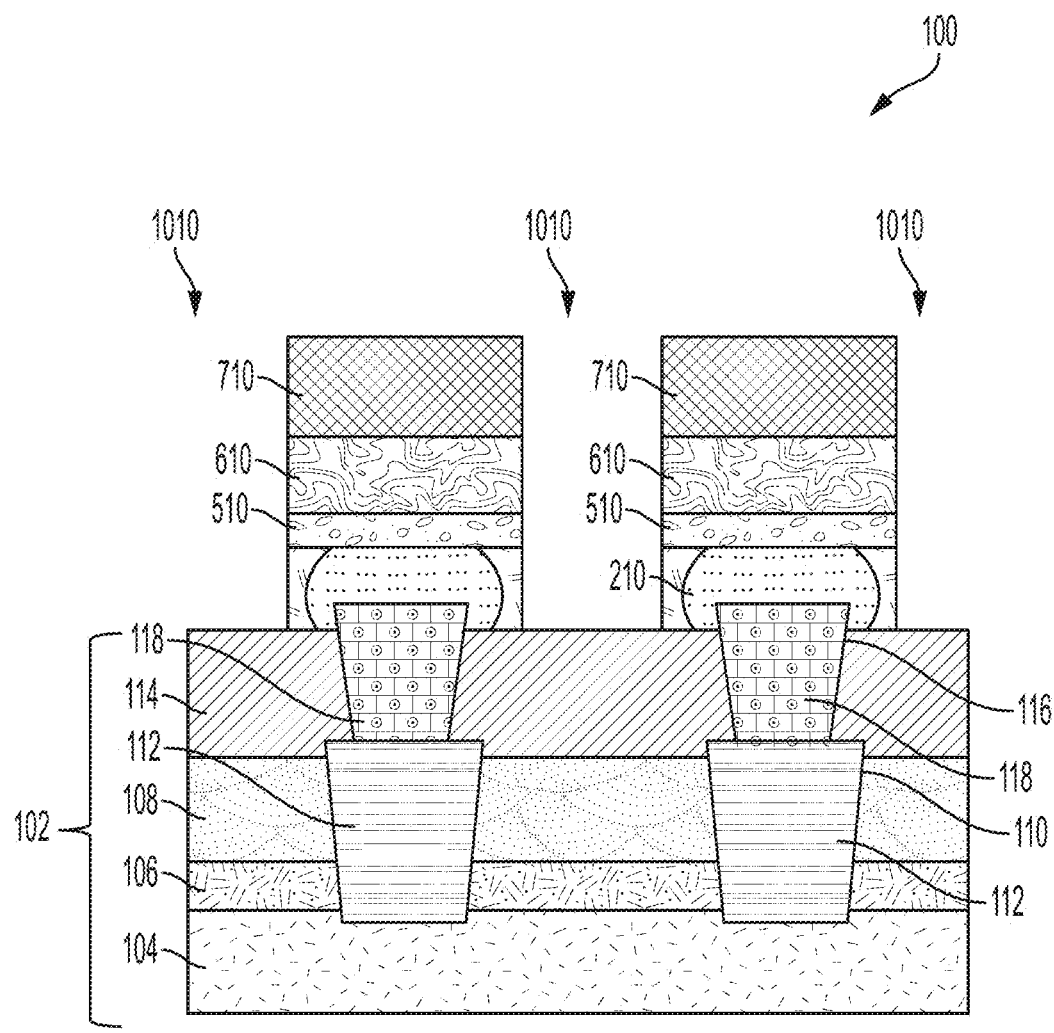
FIG. 10 depicts a cross-sectional view of a semiconductor structure after a processing operation according to one or more embodiments of the invention.

FIG. 10 illustrates a cross-sectional view of a structure 100 after performing an etch process in accordance with one or more embodiments of the invention. As shown, an IBE process has been performed to form the trench 1010. The magnetic tunnel junction stack 610, the top layer 510 and the dielectric layer 310 are recessed, exposing the top surface of the underlying structure 102 thus forming the MRAM device. The trench 1010 can also be formed using, for example, a dry etch, a wet etch, or a combination of wet and/or dry etches. In one or more embodiments of the invention, the diameter of the MRAM device is larger than the bottom contact 118 which prevents exposure of bottom layer of the multi-layer electrode during patterning of the MRAM device. The diameter of the MRAM device can range from 50 nm to 500 nm and diameter of the bottom contact can be within 30 nm to 450 nm.

Figure 11:
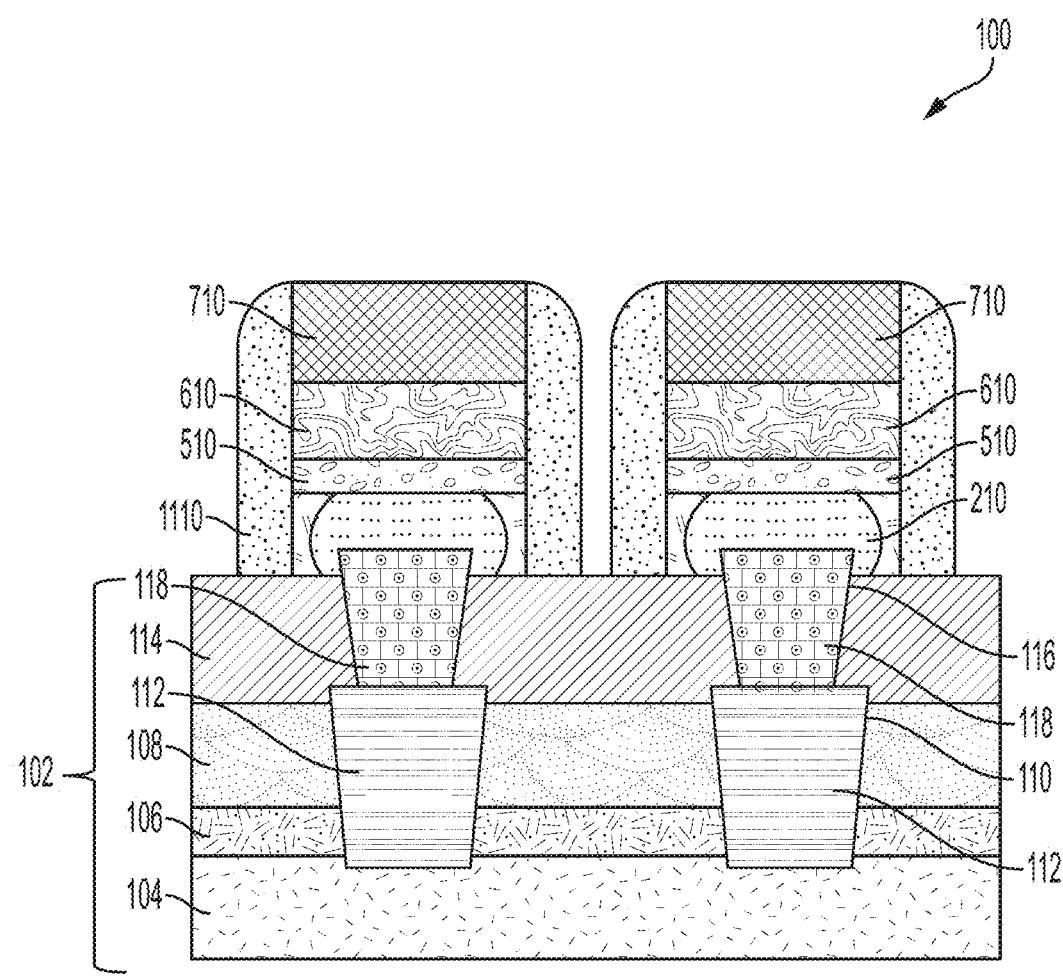
FIG. 11 depicts a cross-sectional view of a semiconductor structure after a processing operation according to one or more embodiments of the invention.

FIG. 11 illustrates a cross-sectional view of a structure 100 after a processing operation according to one or more embodiments of the invention. FIG. 11 is a cross-sectional view after depositing an encapsulation layer 1110 on the magnetic tunnel junction stack 610. The encapsulation layer 1110 includes one or more insulating materials where the encapsulation material is etched back from the top electrode 710 and top surface of dielectric 114. The insulating materials encapsulate the magnetic tunnel junction stack 610. The encapsulation layer 1110 is deposited on the exposed surface and sidewalls of the magnetic tunnel junction stack 610 and multi-layer bottom electrode 500 and the top electrode 710.

The thickness of the encapsulation layer 1110 can generally vary and is not intended to be limited. In some embodiments, the thickness of the encapsulation layer 1110 is in a range from about 50 to about 100 nm. In other embodiments, the thickness of the encapsulation layer 1110 is in a range from about 10 to about 50 nm. To achieve a desired encapsulating layer thickness of, for example, silicon nitride, several cycles of deposition can be performed. To achieve a desired encapsulating layer thickness of, for example, aluminum oxide, several cycles of deposition and oxidation can be performed.

The encapsulation layer 1110 can be deposited by methods such as chemical vapor deposition (CVD), plasma enhanced chemical vapor deposition (PECVD), physical vapor deposition (PVD), and the like. In some embodiments, the encapsulation layer 1110 can be deposited using a CVD method. The CVD method can be performed at a temperature range from about 50 to about 300° C., or from about 150 to about 200° C. In some embodiments, the encapsulation layer 1110 can be deposited using a PECVD method. The PECVD method can be performed at a temperature range from about 50 to about 300° C., or from about 150 to about 200° C.

In some embodiments, the encapsulation layer 1110 can be deposited using a PVD method. The deposition conditions for forming the encapsulation layer 1110 using PVD methods include low sample temperatures (e.g., about room temperature), low power and deposition rates, and slightly reactive plasma. The PVD method can be performed at a temperature range from about 20 to about 25° C., or at room temperature.

The encapsulation layer 1110 can include, for example, AlOx or SiNx. Sub-stoichiometric amounts of AlOx and SiNx can be formed using various levels of the appropriate reactive gas ($O_2$ or $N_2$). The encapsulation layer 1110 can include, for example, $SiN_x$ or $AlO_x$, wherein x is the ratio of N to Si and O to Al, respectively, and x can be varied to range from pure elemental Si/Al to stoichiometric $Si_3N_4$ or $Al_2O_3$. In one embodiment, the encapsulation layer 1110 includes $SiN_x$, and x is from 0 to 1.33 (i.e., pure Si to $Si_3N_4$). In another embodiment, the encapsulation layer 1110 includes $AlO_x$, and x is from 1 to 1.5 (i.e., AlO to $Al_2O_3$). In some embodiments, the encapsulation layer 1110 includes silicon nitride, aluminum oxide, or a combination thereof. An encapsulation etch back process is performed to expose the top surface of the top electrode 710 using RIE, wet process or a combination.

Figure 12:
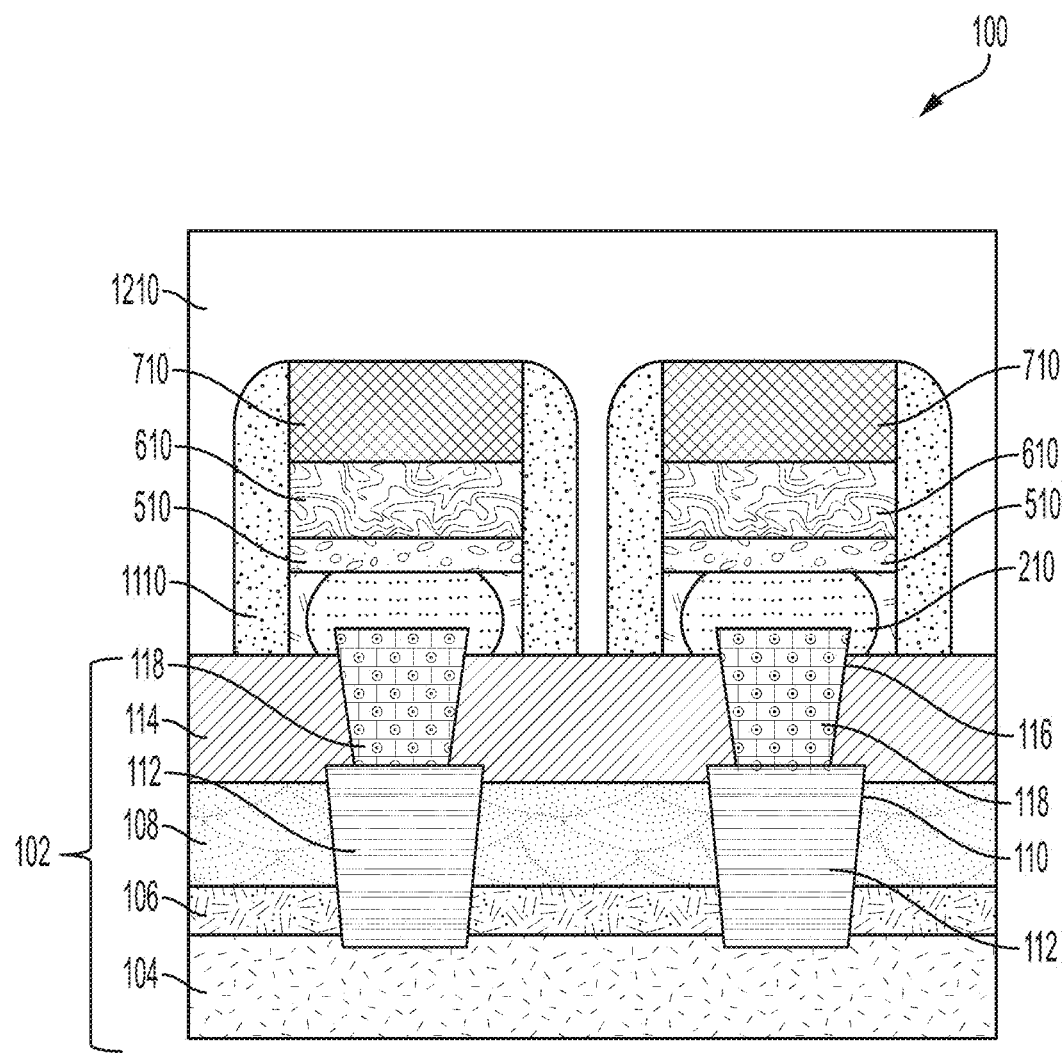
FIG. 12 depicts a cross-sectional view of a semiconductor structure after a processing operation according to one or more embodiments of the invention.

FIG. 12 illustrates a cross-sectional view of a structure 100 after a processing operation according to one or more embodiments of the invention. As shown in FIG. 12, a dielectric 1210 has been formed over the structure 100 in accordance with one or more embodiments of the invention.

Figure 13:
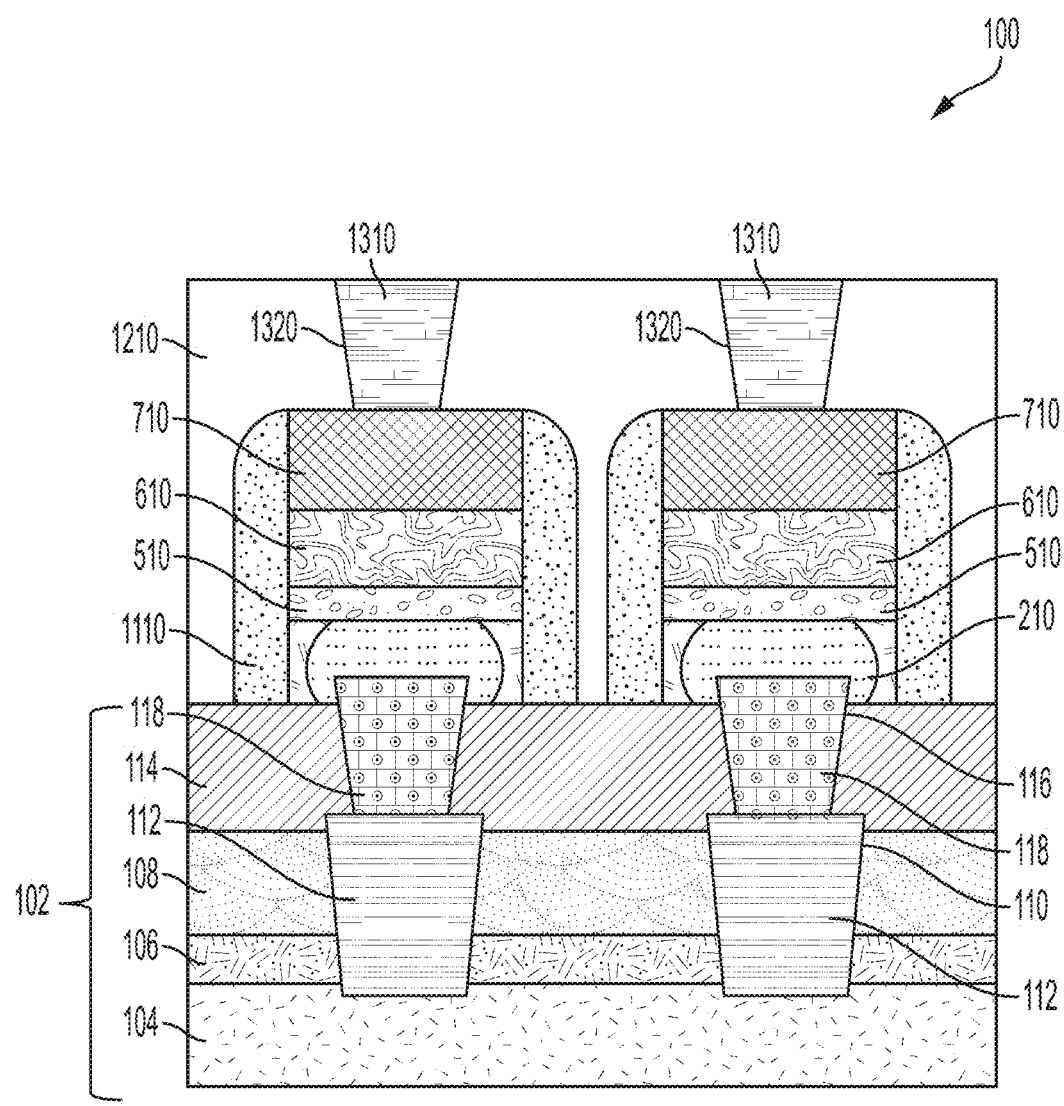
FIG. 13 depicts a cross-sectional view of a semiconductor structure after a processing operation according to one or more embodiments of the invention.

FIG. 13 illustrates a cross-sectional view of a structure 100 after a processing operation according to one or more embodiments of the invention. As shown in FIG. 13, the top electrode contact 1310 has been formed for the structure 100. In one or more embodiments of the invention, a trench is formed in the dielectric 1210 and a liner 1320 can be optionally deposited. Subsequently, the top electrode contact 1310 is deposited and planarized.

Figure 14:
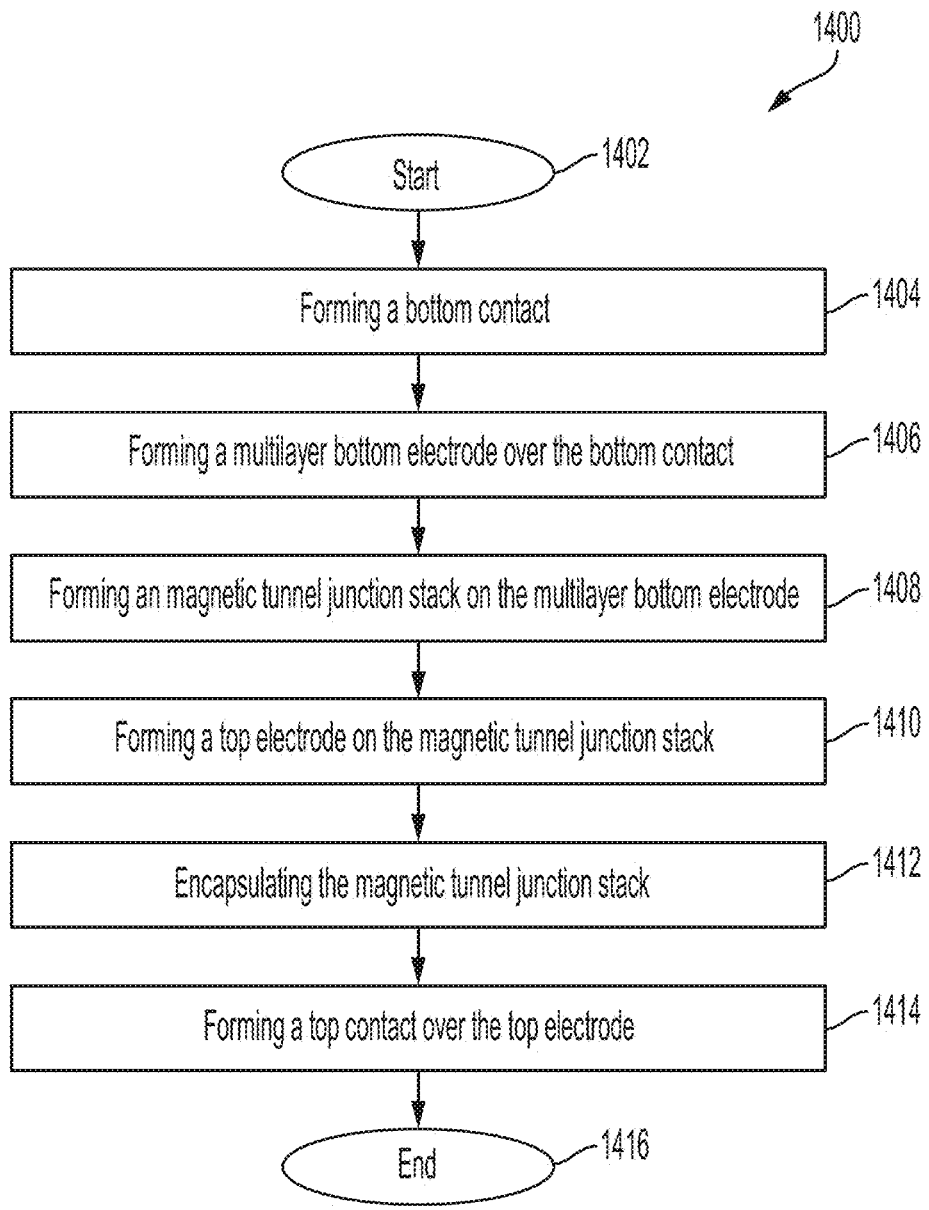
FIG. 14 depicts a flow diagram illustrating a method according to one or more embodiments of the invention.

FIG. 14 depicts a flowchart of a method 1400 for forming a semiconductor device in accordance with one or more embodiments of the invention. The method 1400 begins at block 1402 and proceeds to block 1404 which provides for forming a bottom contact. At block 1406 a multi-layer bottom electrode is formed over the bottom contact. The bottom layer of the multi-layer bottom electrode is formed by selectively growing the bottom layer on the exposed portion of the bottom contact. Next, a dielectric is deposited over the bottom layer and exposed portions. Then, a CMP is performed to the dielectric and the bottom layer.

The top layer of the multi-layer bottom electrode is deposited on top of the dielectric and bottom layer. Subsequently, the top layer is polished to provide a flat surface for forming the magnetic tunnel junction stack. In one or more embodiments of the invention, the top layer of the multi-layer bottom electrode is a thin metal deposition layer that is polished to provide a flat service for the magnetic tunnel junction stack. In one or more embodiments of the invention, the bottom layer of the multi-layer bottom electrode is greater than 10 nm in thickness and the top layer of the multi-layer bottom electrode is less than 10 nm in thickness.

In one or more embodiments of the invention, the bottom layer is formed using a selective deposition process, such as, but not limited to an ALD process or a CVD process. In one or more embodiments of the invention, the bottom layer of the multi-layer bottom electrode is composed of multiple layers of metal. In one or more embodiments of the invention, the multi-layer bottom electrode is self-aligned with the bottom contact.

At block 1408 a magnetic tunnel junction stack is formed on the multi-layer bottom electrode. At block 1410 a top electrode is formed on the magnetic tunnel junction stack. At block 1412 the multi-layer bottom electrode, the magnetic tunnel junction stack, and the top electrode are encapsulated. At block 1414 a top contact is formed over the top electrode. The method 1400 ends at block 1416. It should be understood that the method 1400 shown in FIG. 1416 are not intended to be limiting, and that other steps can be used to from the semiconductor device.

The technical effects and benefits include eliminating junction shorts due to the metal redeposition on the magnetic tunnel junction device during the IBE of thick bottom electrode. The selectively deposited bottom layer of the bottom electrode allows for an increase in the bottom electrode thickness without needing IBE to pattern it. This helps to eliminate the footing and footer flaring of the bottom electrode of the conventional techniques which increase the device footprint.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a bottom contact;
    forming a multi-layer bottom electrode over the bottom contact, wherein forming the multi-layer bottom electrode further comprises:
        forming a bottom layer of the multi-layer bottom electrode over the bottom contact, wherein a portion of the bottom layer is formed under a topmost portion of the bottom contact;
        depositing a dielectric layer over the bottom layer; and
        forming a top layer of the multi-layer bottom electrode over the dielectric layer and the bottom layer, wherein the top layer is a planar surface including a bottom side of the planer surface, wherein the bottom side of the planar surface contacts the dielectric layer and the bottom layer;
    forming a magnetic tunnel junction stack on the multi-layer bottom electrode; and
    forming a top electrode on the magnetic tunnel junction stack.

2. The method of claim 1, wherein the bottom layer is formed in a different step from the top layer, wherein the bottom layer is formed during a pre-ion beam etch (IBE) process.

3. The method of claim 1 further comprising forming a metal liner for the bottom contact, wherein a portion of the bottom layer is formed under a topmost portion of the metal liner of the bottom contact.

4. The method of claim 1, wherein the bottom layer is formed by a selectively depositing a metal on a top surface of the bottom contact.

5. The method of claim 4, wherein the selective deposition is at least one of an atomic layer deposition (ALD) process or a chemical vapor deposition (CVD) process.

6. The method of claim 1, wherein the bottom layer of the multi-layer bottom electrode is greater than 10 nm in thickness and the top layer of the multi-layer bottom electrode is less than 10 nm in thickness.

7. The method of claim 1, wherein a width of the bottom layer of the multi-layer bottom electrode is different than a width of the top layer.

8. The method of claim 1 further comprising polishing the top layer of the multi-layer bottom electrode to provide a flat surface for forming the magnetic tunnel junction stack.

9. The method of claim 1 further comprising forming an encapsulation layer to encapsulate the multi-layer bottom electrode, the magnetic tunnel junction stack, and the top electrode.

10. The method of claim 1, wherein the magnetic tunnel junction stack, the top layer, and the dielectric layer form a magnetoresistive random access memory (MRAM) device, wherein a diameter of the MRAM device is larger than the bottom layer.

11. The method of claim 10, wherein the diameter of the MRAM device prevents the exposure of the bottom layer during patterning of the MRAM device.

12. A semiconductor device comprising:
    a bottom contact;
    a multi-layer bottom electrode formed over the bottom contact, wherein the multi-layer bottom electrode comprises:
        a bottom layer of the multi-layer bottom electrode formed over the bottom contact, wherein a portion of the bottom layer is formed under a topmost portion of the bottom contact;
        a dielectric layer formed over the bottom layer; and
        a top layer of the multi-layer bottom electrode formed over the dielectric layer and the bottom layer, wherein the top layer is a planar surface including a bottom side of the planer surface, wherein the bottom side of the planar surface contacts the dielectric layer and the bottom layer;
    a magnetic tunnel junction stack formed over the multi-layer bottom electrode; and
    a top electrode formed over the magnetic tunnel junction stack.

13. The semiconductor device of claim 12, wherein a topmost portion of the bottom contact is above a bottommost portion of the bottom layer of the multi-layer bottom electrode.

14. The semiconductor device of claim 12 further comprising a metal liner for the bottom contact, wherein a portion the bottom layer is formed under a topmost portion of the metal liner of the bottom contact.

15. The semiconductor device of claim 12, wherein the bottom layer of the multi-layer bottom electrode is greater than 10 nm in thickness and the top layer of the multi-layer bottom electrode is less than 10 nm in thickness.

16. The semiconductor device of claim 12, wherein a width of the bottom layer of the multi-layer bottom electrode is different than a width of the top layer.

17. The semiconductor device of claim 12, wherein the top layer is a polished top layer of the multi-layer bottom electrode that provides a flat service for forming the magnetic tunnel junction stack.

18. The semiconductor device of claim 12 further comprising an encapsulation layer formed on sidewalls of the multi-layer bottom electrode, the magnetic tunnel junction stack, and the top electrode.

19. The semiconductor device of claim 12, wherein the magnetic tunnel junction stack, the top layer, and the dielectric layer form a magnetoresistive random access memory (MRAM) device, wherein a diameter of the MRAM device is larger than the bottom layer.

\* \* \* \* \*